(12) United States Patent
Ishio et al.

(10) Patent No.: US 6,933,582 B2
(45) Date of Patent: Aug. 23, 2005

(54) SEMICONDUCTOR SENSOR HAVING A DIFFUSED RESISTOR

(75) Inventors: Seiichiro Ishio, Kariya (JP); Eishi Kawasaki, Kuwana (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/461,336

(22) Filed: Jun. 16, 2003

(65) Prior Publication Data

US 2004/0012059 A1 Jan. 22, 2004

(30) Foreign Application Priority Data

Jul. 22, 2002 (JP) .......................................... 2002-212214
May 14, 2003 (JP) .......................................... 2003-136487

(51) Int. Cl.[7] .............................................. H01L 29/82
(52) U.S. Cl. ........................ 257/419; 257/414; 257/417
(58) Field of Search .......................... 257/415, 417–419

(56) References Cited

U.S. PATENT DOCUMENTS 5,614,753 A * 3/1997 Uchikoshi et al. .......... 257/417
5,932,921 A * 8/1999 Sakai et al. ................. 257/419
6,218,717 B1 * 4/2001 Toyoda et al. .............. 257/419

FOREIGN PATENT DOCUMENTS

| JP | A-S57-34373 | 2/1982 |
| JP | A-H2-116174 | 4/1990 |
| JP | B2-2871064 | 1/1999 |

* cited by examiner

*Primary Examiner*—Ori Nadav
(74) *Attorney, Agent, or Firm*—Posz Law Group, PLC

(57) ABSTRACT

A semiconductor sensor includes a P-type semiconductor substrate having a N-type semiconductor layer disposed on one surface of the substrate and a P-type diffused resistor disposed in the N-type semiconductor layer. A first electric voltage is applied to the N-type semiconductor layer, a second electric voltage is applied to the substrate, a third electric voltage is applied to the P-type diffused resistor. The first electric voltage is higher than the second and third electric voltages. The sensor ensures stable operation against electric leakage and high noise protection because two depletion layers are formed.

12 Claims, 6 Drawing Sheets

SEMICONDUCTOR SENSOR HAVING A DIFFUSED RESISTOR

CROSS REFERENCE TO RELATED APPLICATION

This application is based on Japanese Patent Applications No. 2002-212214 filed on Jul. 22, 2002, and No. 2003-136487 filed on May 14, 2003, the disclosure of which is incorporated herein by references.

FIELD OF THE INVENTION

The present invention relates to a semiconductor sensor having a diffused resistor on a semiconductor substrate. Specifically, the present invention relates to a semiconductor pressure sensor for detecting a pressure by using piezoresistance effect of a diffused resistor.

BACKGROUND OF THE INVENTION

Recently, a semiconductor pressure sensor is proposed, for example, in JP-2871064 (JP Application Laid-open No. H04-162779). The semiconductor pressure sensor 110 is constructed as shown in FIGS. 8A and 8B, for detecting hydraulic pressure. It includes a housing 16, a seating 1a made of Pyrex glass, a N-type silicon (i.e., Si) substrate 3a bonded on the seating 1a, four piezoresistors 5a formed on one surface of the substrate 3a, an insulation film 6a formed on the substrate 3a, signal electrodes 7a, and a fixed potential electrode 8a.

Each piezoresistor 5a is formed by doping boron particles in the substrate 3a. The substrate 3a includes a diaphragm part 80a, which is disposed on the seating 1a surface that is opposite to the piezoresistor 5a, so that the diaphragm part 80a contacts water as an object of measurement. The water is introduced from an outside of the sensor 110 through a passage (not shown). Each signal electrode 7a, the fixed potential electrode 7a, and an electrode pin (not shown) are connected with an aluminum wiring layer (not shown). The aluminum wiring layer is formed on the insulation film 6a.

Four piezoresistors 5a form a bridge circuit, as shown in FIG. 8B. A bias voltage Vb is applied between the fixed potential electrode 8a and a maximum potential point VL that has the highest potential in the bridge circuit. Because of the bias voltage Vb, a reversed bias is applied to a PN junction in the sensor 110, so that a depletion layer of the PN junction is formed. This depletion layer has a capacitance 12 so that the capacitance 12 reduces an alternating current noise mixing into the sensor 110 by passing through the capacitor of the depletion layer.

However, a semiconductor pressure sensor is required to detect not only hydraulic pressure but also oil pressure, atmospheric pressure and the like. Especially, a semiconductor pressure sensor mounted on an automotive vehicle is required to detect pressures of several fluids. Therefore, each sensor has a different construction, and is mounted on a different position of the vehicle. Thus, the semiconductor pressure sensor is required to be high noise protection.

SUMMARY OF THE INVENTION

In view of the above problems, it is an object of the present invention to provide a semiconductor sensor having stable operation against electric leakage and high noise protection. It is another object of the present invention to provide a method for manufacturing the semiconductor sensor.

A semiconductor sensor includes a P-type semiconductor substrate having a N-type semiconductor layer disposed on one surface of the substrate and a P-type diffused resistor disposed in the N-type semiconductor layer. A first electric voltage is applied to the N-type semiconductor layer, and a second electric voltage is applied to the substrate. The first electric voltage is higher than the second electric voltage.

A PN junction is formed at the interface between the P-type semiconductor substrate and the N-type semiconductor layer. When the first electric voltage is higher than the second electric voltage, a reversed bias is applied to the PN junction, so that a depletion layer is formed at the interface. The depletion layer forms a capacitor so that the depletion layer reduces a noise mixing into the sensor. Therefore, the sensor ensures stable operation against electric leakage and high noise protection.

Preferably, a third electric voltage is applied to the P-type diffused resistor, and the first electric voltage is higher than the third electric voltage. In this case, another PN junction is formed at the interface between the P-type diffused resistor and the N-type semiconductor layer. When the first electric voltage is higher than the third electric voltage, a reversed bias is applied to the PN junction, so that another depletion layer is formed at the interface between the P-type diffused resistor and the N-type semiconductor layer. This depletion layer forms a capacitor, so that the depletion layer reduces a noise mixing into the sensor. Accordingly, the sensor is protected from the noise by the depletion layers, doubly.

Preferably, the sensor includes a densely doped N-type diffusion area disposed in the N-type semiconductor layer so that the first electric voltage is applied to the N-type semiconductor layer through the densely doped N-type diffusion area. In this case, the densely doped N-type diffusion area connects to the N-type semiconductor layer with ohmic contact. Therefore, the first electric voltage can be accurately applied to the N-type semiconductor layer through the densely doped N-type diffusion area because of the ohmic contact.

Preferably, the sensor includes a densely doped P-type diffusion area disposed in the N-type semiconductor layer and the substrate. The densely doped P-type diffusion area pierces the N-type epitaxial layer, and reaches the substrate, so that the second electric voltage is applied to the substrate through the densely doped P-type diffusion area. In this case, the densely doped P-type diffusion area connects to the substrate with ohmic contact. Therefore, the second electric voltage can be accurately applied to the substrate through the densely doped P-type diffusion area because of the ohmic contact.

Although the N-type semiconductor layer is formed in the P-type semiconductor substrate, and the P-type diffused resistor is formed in the N-type semiconductor layer in the above sensor, a P-type semiconductor layer can be formed in a N-type semiconductor substrate, and a N-type diffused resistor can be formed in the P-type semiconductor layer. In this case, the preferable magnitude order of the first, second, and third electric voltages is reversed, i.e., the first electric voltage is preferably lower than the second electric voltage, and the first electric voltage is also preferably lower than the third electric voltage.

A method for manufacturing a semiconductor sensor having a P-type diffused resistor includes steps of forming a N-type semiconductor layer on one surface of a P-type semiconductor substrate, forming a plurality of P-type diffused resistors in the N-type semiconductor layer, and forming an electric bridge circuit composed of the plurality of P-type diffused resistors so that the bridge circuit detects a pressure.

The semiconductor sensor manufactured by the above method exhibits stable operation against electric leakage and high noise protection.

Preferably, the method further includes steps of forming a densely doped N-type diffusion area in the N-type semiconductor layer so that a first electric voltage is applied to the N-type semiconductor layer through the densely doped N-type diffusion area, forming a densely doped P-type diffusion area in the N-type semiconductor layer and the substrate so that a second electric voltage is applied to the substrate through the densely doped P-type diffusion area, and forming an electrode so that a third electric voltage is applied to the bridge circuit. Here, the densely doped P-type diffusion area pierces the N-type semiconductor layer, and reaches the substrate. The first electric voltage is higher than the second and third electric voltages.

Although the N-type semiconductor layer is formed in the P-type semiconductor substrate, and the P-type diffused resistor is formed in the N-type semiconductor layer in the above manufacturing method, a P-type semiconductor layer can be formed in a N-type semiconductor substrate, and a N-type diffused resistor can be formed in the P-type semiconductor layer. In this case, the preferable magnitude order of the first, second, and third electric voltages is reversed, i.e., the first electric voltage is preferably lower than the second and third electric voltages.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
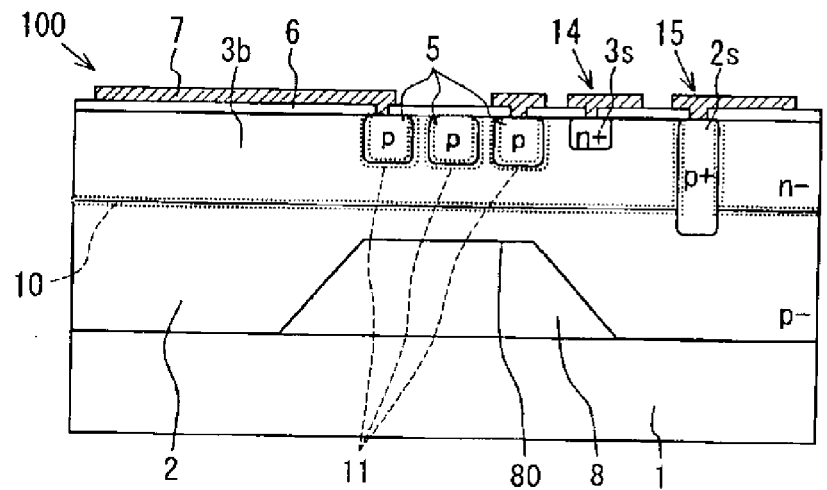
FIG. 1A is a schematic cross-sectional view showing a semiconductor pressure sensor according to the first embodiment of the present invention.
Figure 1B:
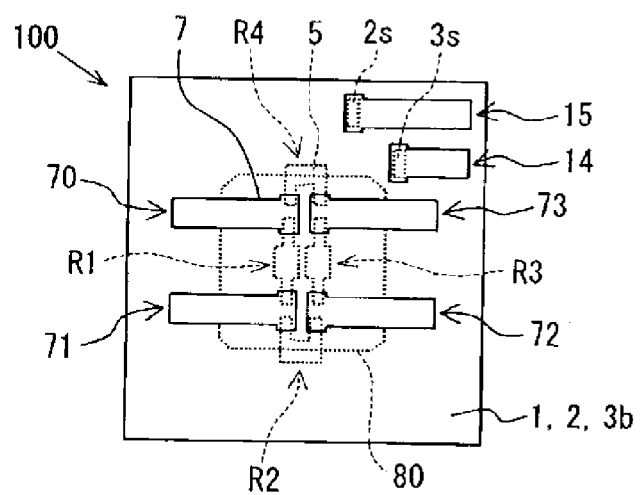
FIG. 1B is a plan view showing the sensor of the first embodiment.
Figure 1C:
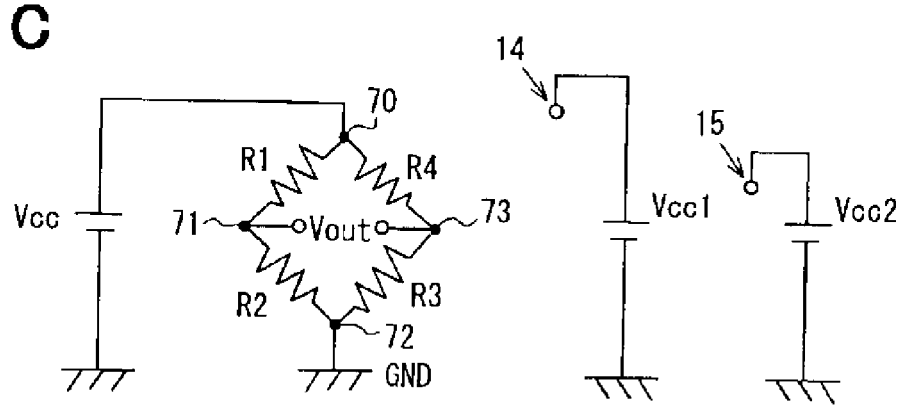
FIG. 1C is a schematic circuit diagram showing an equivalent circuit of the sensor of the first embodiment.

A semiconductor pressure sensor 100 according to the first embodiment of the present invention is constructed, as shown in FIGS. 1A to 1C. The sensor 100 detects, for example, atmospheric pressure. The sensor 100 has a vacuum cavity 8 between a P-type Si substrate 2 and a seating 1 made of glass. The sensor 100 detects atmospheric pressure by using the vacuum cavity 8 as a reference of pressure. The sensor 100 includes the P-type Si substrate 2. A N-type epitaxial layer 3b is formed on the upper surface of the substrate 2, and four piezoresistors R1–R4 are formed in the epitaxial layer 3b.

Each piezoresistor R1–R4 is made of a P-type diffused resistor 5. This P-type diffused resistor 5 exhibits a piezo-resistance effect. The sensor 100 detects a pressure by using the piezo-resistance effect of the diffused resistor 5. The sensor 100 includes an insulation film 6 formed on the epitaxial layer 3b, and an electrode wiring 7 formed on the insulation film 6.

A densely doped N-type diffusion area 3s is formed in the N-type epitaxial layer 3b so as to connect to the N-type epitaxial layer 3b with ohmic contact. A predetermined voltage is applied to the N-type epitaxial layer 3b through the densely doped N-type diffusion area 3s. Therefore, the predetermined voltage can be applied to the N-type epitaxial layer 3b accurately because of the ohmic contact. A densely doped P-type diffusion area 2s is formed in the N-type epitaxial layer 3b and the P-type Si substrate 2. The densely doped P-type diffusion area 2s pieces the N-type epitaxial layer 3b, and reaches the P-type Si substrate 2. This densely doped P-type diffusion area 2s also connects to the P-type Si substrate 2 with ohmic contact so that another predetermined voltage can be applied to the substrate 2 accurately.

A diaphragm part 80 is formed in the substrate 2 so as to promote a sensor sensitivity of the sensor 100. Two piezoresistors R1, R3 are disposed on the center of the diaphragm part 80, and two piezoresistors R2, R4 are disposed on the periphery of the diaphragm part 80 so that the sensor 100 exhibits the maximum sensitivity. The sensor 100 includes four terminals 70–73, which correspond to four nodes 70–73 shown in FIG. 1C.

The sensor 100 further includes two terminals 14, 15. The terminal 14 connects to the densely doped N-type diffusion area 3s, so that an electric voltage is applied to the N-type epitaxial layer 3b through the terminal 14 and the densely doped N-type diffusion area 3s. The terminal 15 connects to the densely doped P-type diffusion area 2s, so that another electric voltage is applied to the substrate 2 through the terminal 15 and the densely doped P-type diffusion area 2s.

As shown in FIG. 1C, an input voltage Vcc is applied to the terminal 70, and an output voltage Vout is output from the terminals 71, 73. Here, the terminal 70 is a maximum potential point that has the highest potential in the bridge circuit. A first bias voltage Vcc1 is applied to the N-type epitaxial layer 3b, and a second bias voltage Vcc2 is applied to the substrate 2. The first bias voltage Vcc1 is higher than the second bias voltage Vcc2. Moreover, the first bias voltage Vcc1 is higher than the input voltage Vcc. For example, the input voltage Vcc is set at 1.8V, the first bias voltage Vcc1 at 2.0V, and the second bias voltage Vcc2 is set between 0V and 1.8V.

A PN junction is formed at the interface between the P-type Si substrate 2 and the N-type epitaxial layer 3b. When the first bias voltage Vcc1 is higher than the second bias voltage Vcc2, a reversed bias is applied to the PN junction, so that a depletion layer 10 is formed at the interface between the P-type Si substrate 2 and the N-type epitaxial layer 3b. The depletion layer 10 forms a capacitor, and operates with a substrate resistance and an outside resistance so that the depletion layer 10 reduces a noise mixing into the sensor 100. Here, the substrate resistance is a resistance of the substrate 2 or the N-type epitaxial layer 3b. The outside resistance is disposed on the outside of the sensor 100. Further, the N-type epitaxial layer 3b is made of an epitaxial layer, so that the interface between the substrate 2 and the epitaxial layer 3b extends to the whole substrate 2. Therefore, the depletion layer 10 as a noise protection area also extends to the whole substrate 2, so that the noise protection of the sensor 100 is promoted.

Another PN junction is formed at the interface between the P-type diffused resistors 5 and the N-type epitaxial layer 3b. When the first bias voltage Vcc1 is higher than the input voltage Vcc, a reversed bias is applied to the PN junction, so that a depletion layer 11 is formed at the interface between the P-type diffused resistors 5 and the N-type epitaxial layer 3b. The depletion layer 11 forms a capacitor, so that the depletion layer 11 reduces a noise mixing into the sensor 100. Accordingly, four piezoresistors R1–R4 is protected from the noise by the depletion layers 10, 11, doubly.

The sensor 100 is manufactured as follows. Firstly, the N-type epitaxial layer 3b is formed on the upper surface of the P-type Si substrate 2. Here, the resistivity of the epitaxial layer 3b is about 10 Ω·cm, and the thickness of the epitaxial layer 3b is about 10 μm. The orientation of the substrate 2 is (110), and the thickness of the substrate 2 is about 0.5 mm–0.6 mm. Preferably, a part of the densely doped P-type diffusion area 2s is embedded in the substrate 2 before the epitaxial layer 3b is formed on the substrate 2, so that it becomes easy to form the diffusion area 2s.

Next, the diffusion area 2s is formed in such a manner that the diffusion area 2s pierces the epitaxial layer 3b and reaches the substrate 2. Boron particles are implanted in the epitaxial layer 3b and the substrate 2 by using ion implantation method with an oxide film as a mask. Then, the substrate 2 is heated so that the boron particles are diffused. Thus, the diffusion area 2s is formed. Besides, when the part of the diffusion area 2s is embedded in the substrate 2 preliminarily, the diffusion area 2s is formed in such a manner that the embedded diffusion area 2s and the boron implanted area are combined after thermal diffusion.

Next, a thin oxide film is formed on the epitaxial layer 3b. The thickness of the oxide film is about 100 nm. After that, boron particles are implanted in the epitaxial layer 3b by using ion implantation method with a photo-resist as a mask, so that the P-type diffused resistor is formed. Then, phosphorus particles are implanted in the epitaxial layer 3b by using ion implantation method with a photo-resist as a mask, so that the densely doped N-type diffusion area 3s is formed.

Next, a silicon oxide film or a silicon nitride film as an insulation film 6 is formed by using chemical vapor deposition method. Then, a plurality of contact holes is formed in the insulation film 6 so that an electrode wiring 7 contacts the diffused resistor 5, the diffusion area 3s, and the diffusion area 2s through the contact holes. The electrode wiring 7 is formed by depositing aluminum and the like. Then, the electrode wiring 7 is patterned so that the terminals 14, 15 and the like are formed. A passivation film (not shown) is formed to cover the whole upper surface of the substrate 2.

After that, the lower surface of the substrate 2 is processed, which is opposite to the upper surface. Firstly, the lower surface of the substrate 2 is polished so that the thickness of the substrate 2 becomes about 0.3 mm. Then, the lower surface of the substrate 2 is etched with a mask of a nitride film so that the diaphragm part 80 is formed. Here, the substrate 2 is etched by using an alkaline etchant such as tetramethylammonium hydroxide (i.e., TMAH) and potassium hydroxide (i.e., KOH), which exhibits anisotropic etching characteristic.

Next, the seating 1 is bonded to the lower surface of the substrate 2. Here, a coefficient of thermal expansion of the seating 1 is almost equal to that of silicon. This bonding is preformed by anode bonding method at about 380° C. in vacuum below a few kPa.

Thus, the sensor 100 is completed.

Figure 2A:
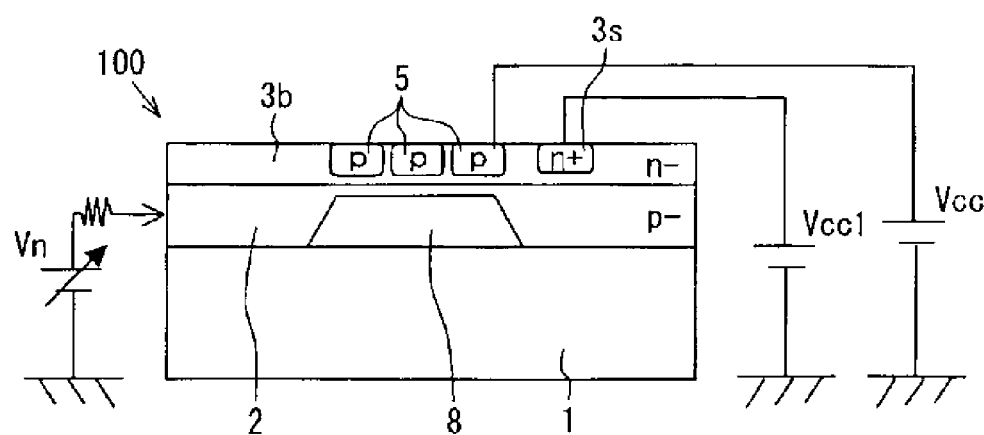
FIG. 2A is a schematic view showing an electric leakage test circuit of the sensor of the first embodiment.
Figure 2B:
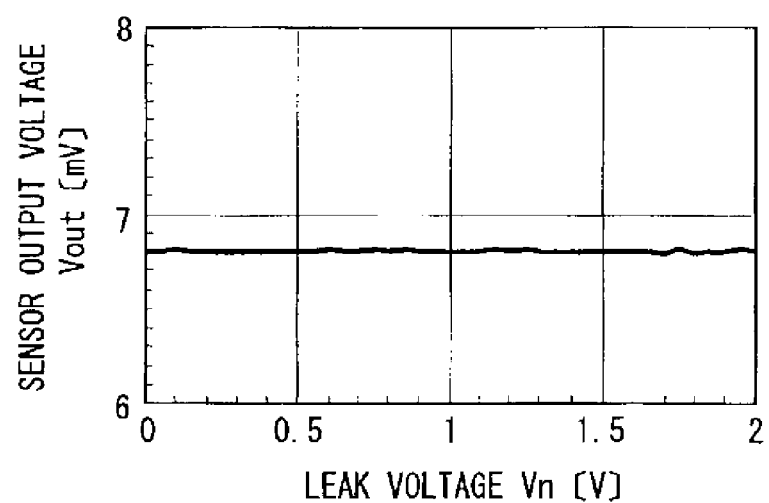
FIG. 2B is a graph showing a relationship between a leak voltage and an output voltage of the sensor of the first embodiment.

The sensor 100 is tested, as shown in FIGS. 2A and 2B. The input voltage Vcc, which is 1.8V, is applied to the terminal 70. The first bias voltage Vcc1, which is 2.0V, is applied to the epitaxial layer 3b through the diffusion area 3s. A leak voltage Vn, which is between 0V and 2.0V, is applied to the substrate 2. Then, the sensor output voltage Vout is measured. Here, the sensor sensitivity is 136 μV/kPa, and the measurement is performed in atmospheric pressure, i.e., in 100 kPa. Each resistance of four piezoresistors is set in a manner that the sensor output voltage Vout becomes 6.8 mV when the leak voltage Vn is 0V.

As shown in FIG. 2B, even though the leak voltage Vn changes, the sensor output voltage Vout is substantially equal to a setting voltage, i.e., 6.8 mV. In other words, even when the potential of the substrate 2 is changed by the leak voltage Vn, the sensor output voltage Vout is substantially stabilized. Thus, the operation of the sensor 100 is stabilized against an electric leakage. Therefore, even if a noise mixes into the sensor 100 through the substrate 2, the sensor 100 ensures stable operation against electric leakage and high noise protection.

Second embodiment

Figure 3A:
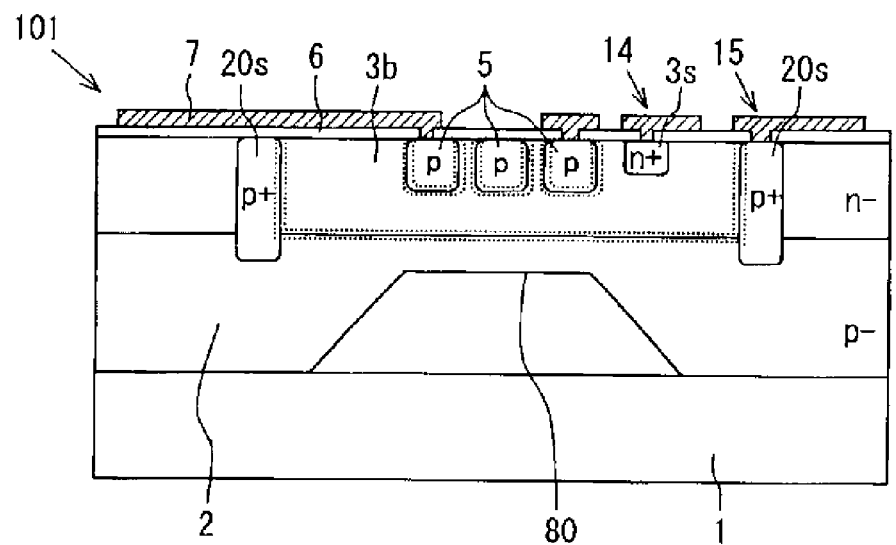
FIG. 3A is a schematic cross-sectional view showing a semiconductor pressure sensor according to the second embodiment of the present invention.
Figure 3B:
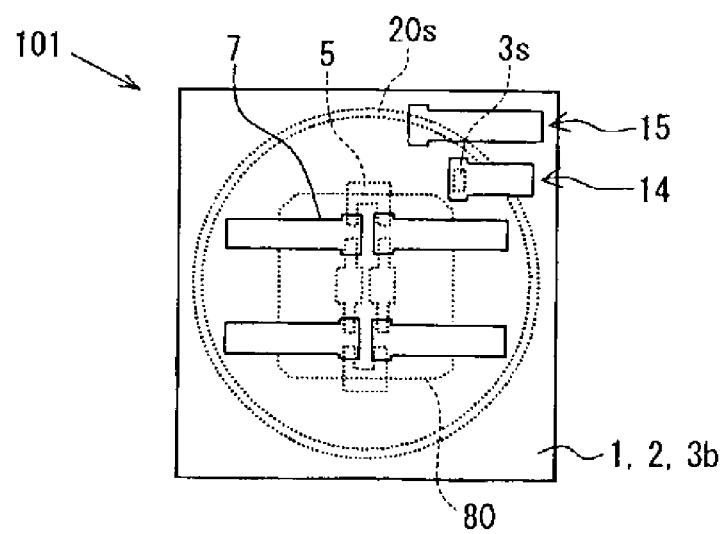
FIG. 3B is a plan view showing the sensor of the second embodiment.

In the second embodiment, a semiconductor pressure sensor 101 includes a densely doped P-type diffusion area 20s surrounding four P-type diffused resistors 5 as the piezoresistors R1–R4, as shown in FIGS. 3A and 3B.

The diffusion area 20s functions not only as an ohmic contact pad connecting to the P-type Si substrate 2 but also as a shield restricting a noise mixing into the sensor 101. Moreover, a part of the N-type epitaxial layer 3b, in which four diffused resistors 5 and the densely doped N-type diffusion area 3s are formed, is isolated by the diffusion area 20s and the substrate 2. Therefore, each electric potential of four diffused resistors 5 is stabilized, even when electric leakage occurs at the periphery of the substrate 2. Thus, the sensor 101 ensures stable operation against electric leakage, and the influence of the noise in the sensor 101 can be reduced.

Third Embodiment

Figure 4:
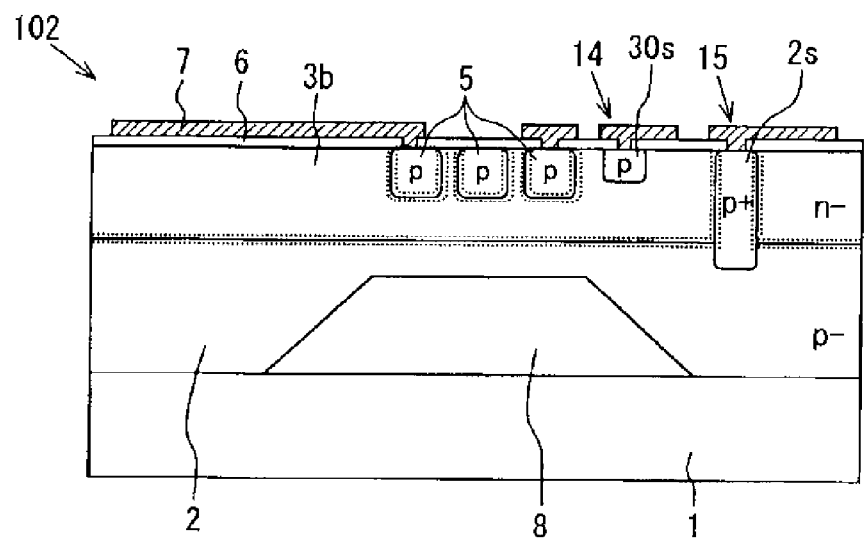
FIG. 4 is a schematic cross-sectional view showing a semiconductor pressure sensor according to the third embodiment of the present invention.

In the third embodiment, a semiconductor pressure sensor 102 includes a P-type diffusion area 30s, as shown in FIG. 4. The P-type diffusion area 30s is formed in the N-type epitaxial layer 3b. The diffusion area 30s functions as a low resistance contact pad connecting to the N-type epitaxial layer 3b. However, the p-type diffusion area 30s can be formed simultaneously with forming four P-type diffused resistors 5. Therefore, a manufacturing cost of the sensor 102 can be reduced.

In the sensor 102, the interface between the P-type diffusion region 30s and the N-type epitaxial layer 3b becomes a PN junction. Accordingly, the first bias voltage Vcc1 applied to the epitaxial layer 3b is determined by considering a voltage drop of this PN junction.

Fourth Embodiment

Figure 5:
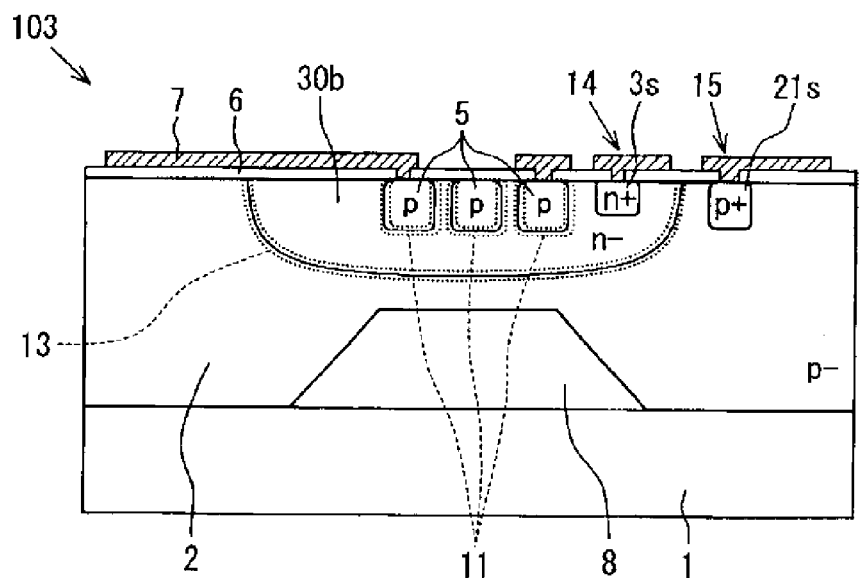
FIG. 5 is a schematic cross-sectional view showing a semiconductor pressure sensor according to the fourth embodiment of the present invention.

In the fourth embodiment, a semiconductor pressure sensor 103 includes a N-type diffusion area 30b formed in the P-type Si substrate 2, as shown in FIG. 5. Four P-type diffused resistors 5 are formed in the N-type diffusion area 30b. A densely doped P-type diffusion area 21s is formed in the substrate 2, and the second bias voltage Vcc2 is applied to the substrate 2 through the diffusion area 21s.

In the sensor 103, the interface between the P-type Si substrate 2 and the N-type diffusion area 30b becomes a PN junction. The first bias voltage Vcc1 applied to the N-type diffusion area 30b is higher than the second bias voltage Vcc2 applied to the P-type Si substrate 2. Besides, the first bias voltage Vcc1 is higher than the input voltage Vcc applied to the P-type diffused resistors 5. Therefore, a reversed bias is applied to the PN junction between the substrate 2 and the diffusion area 30b, so that a depletion layer 13 is formed at the interface between the substrate 2 and the diffusion area 30b. The depletion layer 13 forms a capacitor, and surrounds the P-type diffused resistors 5 so that the depletion layer 13 reduces a noise mixing into the sensor 100 together with the depletion layer 11 at the interface between the P-type diffused resistors 5 and the N-type diffusion area 30b. Thus, the sensor 103 ensures stable operation and high noise protection.

Fifth Embodiment

Although the N-type epitaxial layer 3b or the N-type diffusion area 30b is formed in the P-type Si substrate 2, and the P-type diffused resistor 5 is formed in the N-type epitaxial layer 3b or the N-type diffusion area 30b, a P-type epitaxial layer or a P-type diffusion area can be formed in a N-type Si substrate, and a N-type diffused resistor can be formed in the P-type epitaxial layer or the P-type diffusion area.

Figure 6A:
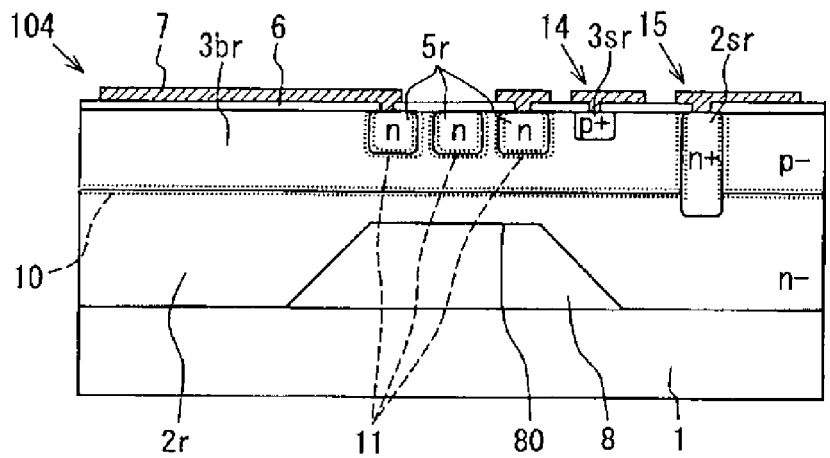
FIG. 6A is a schematic cross-sectional view showing a semiconductor pressure sensor according to the fifth embodiment of the present invention.
Figure 6B:
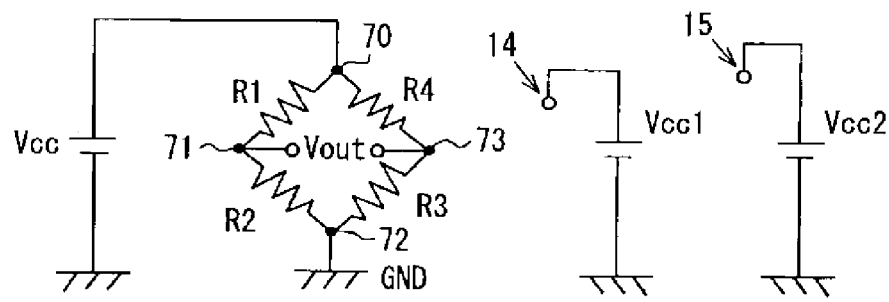
FIG. 6B is a schematic circuit diagram showing an equivalent circuit of the sensor of the fifth embodiment.

For example, as shown in FIGS. 6a and 6B, a semiconductor pressure sensor 104 according to the fifth embodiment of the present invention includes a N-type Si substrate 2r. A P-type epitaxial layer 3br is formed on the upper surface of the substrate 2r. Four N-type diffused resistors 5r as a piezoresistor R1–R4 are formed in the epitaxial layer 3br. A densely doped P-type diffusion area 3sr is formed in the epitaxial layer 3br. The diffusion area 3sr functions as an ohmic contact pad connecting to the epitaxial layer 3br. A densely doped N-type diffusion area 2sr is formed in the epitaxial layer 3br and the substrate 2r. The N-type diffusion area 2sr pierces the epitaxial layer 3br, and reaches the substrate 2r.

The first bias voltage Vcc1 applied to the epitaxial layer 3br through the diffusion area 3sr is lower than the second bias voltage Vcc2 applied to the substrate 2r through the diffusion area 2sr. Therefore, the depletion layer 10 is formed at the interface between the substrate 2r and the epitaxial layer 3br. Moreover, the first bias voltage Vcc1 is lower than the input voltage Vcc applied to the N-type diffused resistors 5r. Therefore, the depletion layer 11 is formed at the interface between the N-type diffused resistors 5r and the epitaxial layer 3br.

The depletion layers 10, 11 reduce a noise mixing into the sensor 104. Accordingly, four piezoresistors R1–R4 are protected from the noise by the depletion layers 10, 11, doubly. Thus, the sensor 104 ensures stable operation and high noise protection.

Although a conductive type, i.e., P-type or N-type, is reversed in the sensor 100 so that the sensor 104 is formed, even in the sensors 101–103, the conductive type can be reversed. In these cases, the magnitude order of the input voltage Vcc and the first and second bias voltages Vcc1, Vcc2 is also reversed, i.e., the first bias voltage Vcc1 is lower than the input voltage Vcc, and the first bias voltage Vcc1 is also lower than the second bias voltage Vcc2.

Sixth Embodiment

Figure 7:
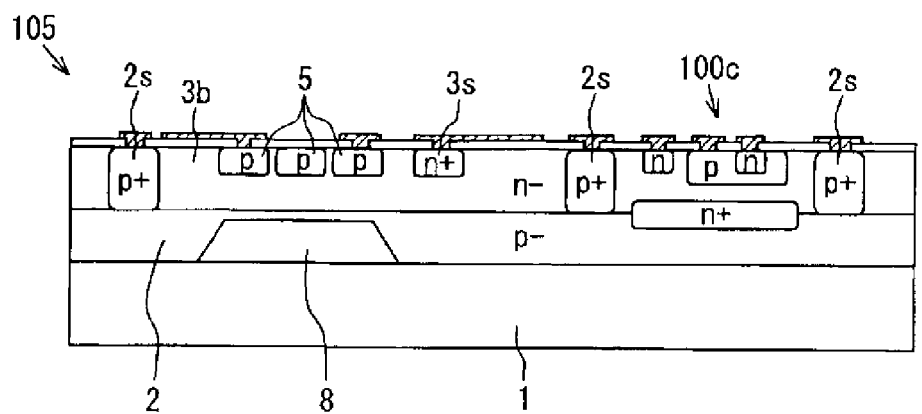
FIG. 7 is a schematic cross-sectional view showing a semiconductor pressure sensor according to the sixth embodiment of the present invention.
Figure 8A:
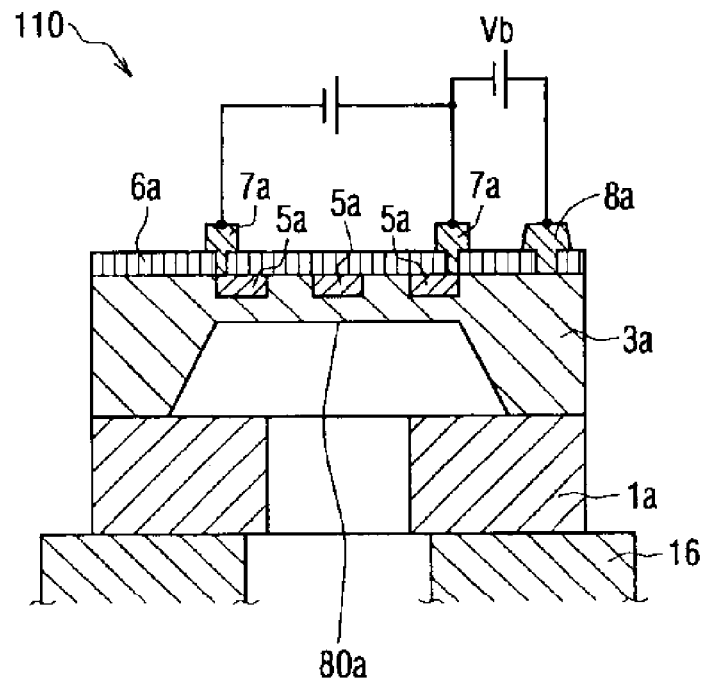
FIG. 8A is a schematic cross-sectional view showing a semiconductor pressure sensor according to a related art.
Figure 8B:
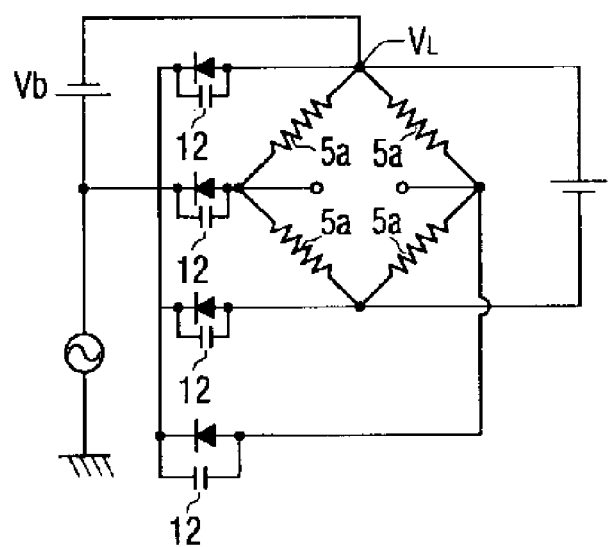
FIG. 8B is a schematic circuit diagram showing an equivalent circuit of the sensor of the related art.

Each semiconductor pressure sensor 100–104 in the above embodiments can be integrated with an electric circuit as a controller of the sensor 100–104. For example, a semiconductor pressure sensor 105 according to the sixth embodiment includes the seating 1, the P-type Si substrate 2, and the N-type epitaxial layer 3b, as shown in FIG. 7. The sensor 105 has four P-type diffused resistors 5 formed in the epitaxial layer 3b, the densely doped N-type diffusion area 3s formed in the epitaxial layer 3b, and the densely doped P-type diffusion area 2s surrounding the diffused resistors 5 and the diffusion area 3s.

An electric circuit 100c for controlling the sensor 105 is formed in the epitaxial layer 3b and the substrate 2. The electric circuit 100c is isolated by the diffusion area 2s. Thus, the electric circuit 100c and the sensor 105 are integrated. Therefore, a manufacturing cost can be reduced, and the integrated sensor 105 can be minimized.

Modifications

Although the sensors 100–105 detect an atmospheric pressure, they can detect hydraulic pressure, oil pressure, and the like.

Although the sensors 100–105 according to the above embodiments are constructed as semiconductor pressure sensors, they can be constructed as other semiconductor sensors, which include a P-type diffused resistor or a N-type diffused resistor.

Such changes and modifications are to be understood as being within the scope of the present invention as defined by the appended claims.

What is claimed is:

1. A semiconductor sensor comprising:
    a P-type semiconductor substrate having a N-type semiconductor layer disposed on one surface of the substrate; and
    a P-type diffused resistor disposed in the N-type semiconductor layer, wherein:
        a first electric voltage is applied to the N-type semiconductor layer;
        a second electric voltage is applied to the substrate;
        the first electric voltage is higher than the second electric voltage;
        a third electric voltage is applied to the P-type diffused resistor;
        the first electric voltage is higher than the third electric voltage; and
        the first, the second, and the third voltages are different from a ground potential.

2. The semiconductor sensor according to claim 1, further comprising a densely doped N-type diffusion area disposed in the N-type semiconductor layer, wherein the first electric voltage is applied to the N-type semiconductor layer through the densely doped N-type diffusion area.

3. The semiconductor sensor according to claim 1, wherein the N-type semiconductor layer is a N-type epitaxial layer.

4. The semiconductor sensor according to claim 3, further comprising a densely doped P-type diffusion area disposed in the N-type epitaxial layer and the substrate, wherein the densely doped P-type diffusion area pierces the N-type epitaxial layer, and reaches the substrate, and wherein the second electric voltage is applied to the substrate through the densely doped P-type diffusion area.

5. The semiconductor sensor according to claim 1, wherein the P-type diffused resistor is a piezoresistor for detecting a pressure applied to the substrate and the N-type semiconductor layer.

6. The semiconductor sensor according to claim 1, wherein the substrate includes a diaphragm part disposed on another surface of the substrate, which is opposite to the N-type semiconductor layer, and wherein the diaphragm part is formed by an anisotropic etching method.

7. The semiconductor sensor according to claim 1, further comprising three more P-type diffused resistors disposed in the N-type semiconductor layer, wherein four P-type diffused resistors form an electric bridge circuit so that the bridge circuit detects a pressure applied to the sensor.

8. The semiconductor sensor according to claim 7, wherein the substrate includes a diaphragm part disposed on another surface of the substrate, which is opposite to the N-type semiconductor layer, and wherein the bridge circuit is disposed on a center of the diaphragm part.

9. The semiconductor sensor according to claim 8, wherein the bridge circuit has a maximum potential point that has the highest potential in the bridge circuit, wherein the maximum potential point is applied with a third electric voltage, and wherein the first electric voltage is higher than the third electric voltage.

10. The semiconductor sensor according to claim 6, wherein the diaphragm part includes a vacuum cavity.

11. The semiconductor sensor according to claim 1, wherein the second electric voltage is substantially equal to the third electric voltage.

12. The semiconductor sensor according to claim 1, wherein the first, the second and the third voltages are higher than the ground potential.

* * * * *